United States Patent
Watson et al.

(10) Patent No.: US 6,842,226 B2
(45) Date of Patent: Jan. 11, 2005

(54) FLEXURE SUPPORTED WAFER TABLE

(75) Inventors: Douglas C. Watson, Campbell, CA (US); Michael Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 137 days.

(21) Appl. No.: 09/960,584

(22) Filed: Sep. 21, 2001

(65) Prior Publication Data

US 2003/0058425 A1 Mar. 27, 2003

(51) Int. Cl.⁷ .................. G03B 27/58; G03B 27/62; G03B 27/42
(52) U.S. Cl. .................. 355/72; 355/75; 355/53
(58) Field of Search .................. 355/53, 75, 72; 356/399, 400, 401; 318/687, 649, 38, 135; 310/12, 112, 90.5

(56) References Cited

U.S. PATENT DOCUMENTS

| | | | |
|---|---|---|---|
| 4,506,204 A | 3/1985 | Galburt | 318/653 |
| 4,952,858 A | 8/1990 | Galburt | 318/647 |
| 5,528,118 A | 6/1996 | Lee | 318/568.17 |
| 5,623,853 A | 4/1997 | Novak et al. | 74/490.09 |
| 5,668,672 A | 9/1997 | Oomura | 359/727 |
| 5,689,377 A | 11/1997 | Takahashi | 359/727 |
| 5,835,275 A | 11/1998 | Takahashi et al. | 359/629 |
| 5,874,820 A | 2/1999 | Lee | 318/575 |
| 5,892,117 A | 4/1999 | Theriot | 564/347 |
| 5,926,681 A | 7/1999 | Ishimaru | 399/367 |
| 5,991,005 A * | 11/1999 | Horikawa et al. | 355/53 |
| 6,130,517 A | 10/2000 | Yuan et al. | 318/640 |
| 6,323,494 B1 * | 11/2001 | Lee | 250/442.11 |
| 6,570,645 B2 * | 5/2003 | Korenaga et al. | 355/75 |

FOREIGN PATENT DOCUMENTS

| | | |
|---|---|---|
| JP | 8-166475 | 6/1996 |
| JP | 8-330224 | 12/1996 |

* cited by examiner

*Primary Examiner*—Peter B. Kim
(74) *Attorney, Agent, or Firm*—Morgan, Lewis & Bockius LLP (57) ABSTRACT

An apparatus and method for supporting and precisely positioning a table or stage with respect to a frame. The table is supported by at least one flexible member which is flexible in a plurality of degrees of freedom. The flexible member is mounted on a base which is movable in an additional degree of freedom. In the context of lithographic semiconductor processing, a wafer stage can thereby be precisely positioned with respect to a frame or reticle in six degrees of freedom.

17 Claims, 6 Drawing Sheets

FIG. 1

PRIOR ART

FLEXURE SUPPORTED WAFER TABLE

FIELD OF THE INVENTION

The present invention is directed to a device and method for supporting and precisely positioning a table with respect to a frame, and specifically for supporting and positioning a table for lithographic semiconductor processing.

BACKGROUND OF THE INVENTION

A number of fields of science and manufacturing require precise positioning of a stage with respect to another stage, a frame, or other frame of reference. One such field is lithography, in particular, as applied to semiconductor wafer fabrication.

In these lithographic systems, a wafer is positioned on a surface, sometimes called a wafer table, which is in turn movable with respect to another surface or frame, sometimes called the wafer stage. The wafer stage may itself be movable. Typically, light, or an electron beam, passes through a mask mounted on a reticle, through a projection lens, and onto the wafer. The beam thereby exposes a pattern on the wafer, as dictated by the mask. Both the reticle and the wafer may be movable, so as to repetitively expose the mask pattern on different portions of the wafer.

Figure 1:
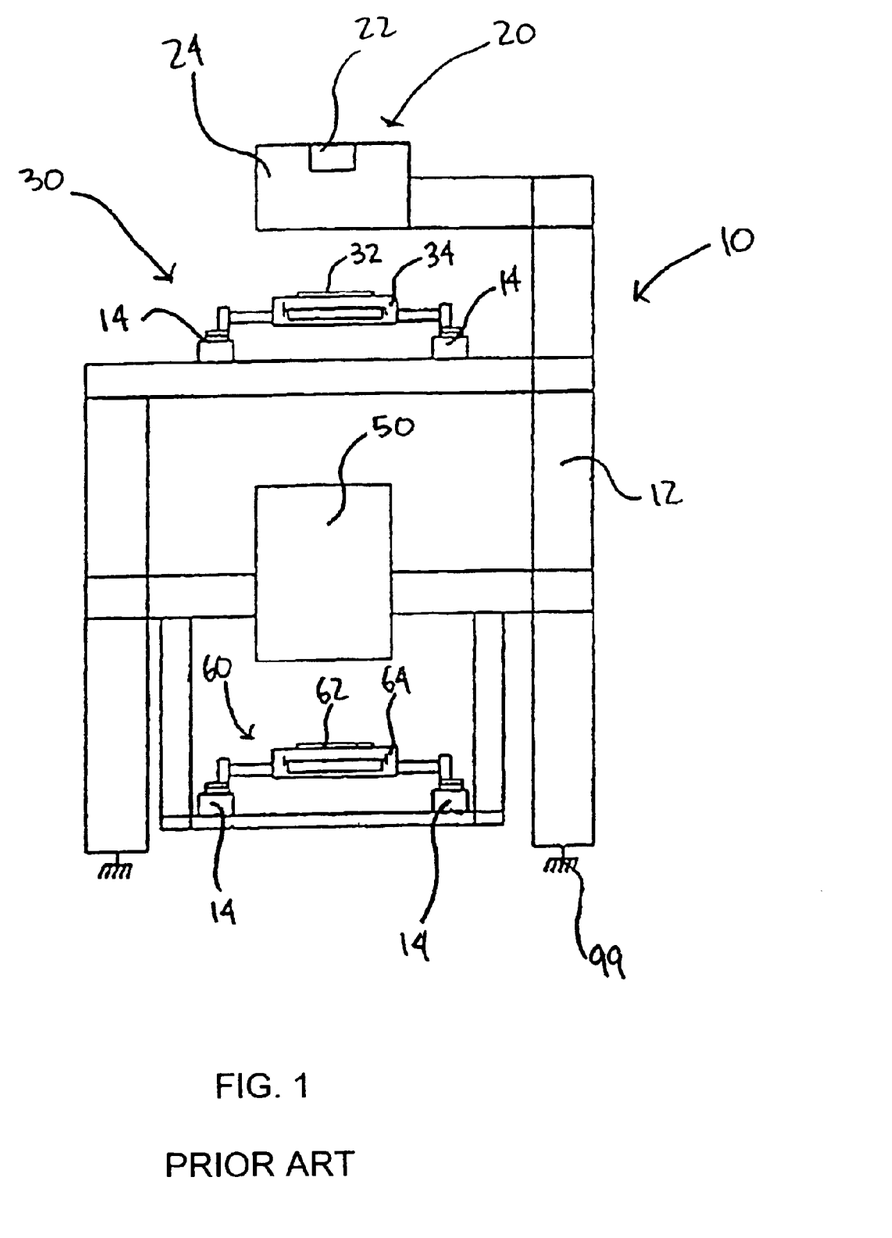
FIG. 1 is a side schematic view of a prior art lithographic semiconductor processing system.

An example of such a system is provided in FIG. 1. As shown in that figure, lithographic processing is performed by an exposure apparatus 10. Generally, a pattern of an integrated circuit is transferred from a reticle 32 onto a semiconductor wafer 62. The exposure apparatus 10 is mounted on a base 99, i.e., a floor, base, or some other supporting structure.

At least some of the components of the exposure apparatus 10 are mounted on a frame 12. In some examples, the frame 12 is rigid. The design of the frame 12 can be varied according to the design requirements of the rest of the exposure apparatus 10. Alternatively, a number of different frames or support structures may be employed to suitably position the various components of the exposure apparatus 10. In the example shown in FIG. 1, the reticle assembly 30, which typically includes a reticle stage 34, holds and positions the reticle 32 relative to the lens assembly 50 and the wafer assembly 60, which typically includes a wafer stage 64. Similarly the wafer stage 64 holds and positions the wafer with respect to the projected image of the reticle 32. In the prior art, various devices 14 may be employed to achieve such positioning, including linear and planar motors. The requirements for this positioning may vary with the design requirements of the system.

The illumination system 20 provides a light source for exposure of the wafer. In some examples, the illumination system 20 includes an illumination source 22 and an illumination optical assembly 24. The illumination source 22 emits a beam of light energy. The illumination optical assembly 24 guides the beam of light energy from the illumination source 22 to the lens assembly 50. The beam illuminates selectively different portions of the reticle 32 and exposes the wafer 62. In FIG. 1, the illumination source 22 is supported above the reticle 32. Alternatively, the illumination source is positioned to one side of the of the frame 12, and the optical assembly 24 directs the light energy to the reticle 32.

Each of the components of such a system may require precise positioning. In particular, the mask and/or the wafer must be precisely positioned relative to each other and relative to the lens, so that the mask pattern is exposed on the appropriate portion of the wafer. To achieve such positioning, various components of the system may be adjustable. In particular, the reticle and/or the lens may be adjustable. Further, the wafer stage may be adjustable. A method of extremely fine adjustment is needed to precisely position the components with respect to each other.

Various designs have been proposed to provide such precise positioning. For instance, U.S. Pat. No. 4,506,204 discloses apparatus for electromagnetic alignment using at least three magnet assemblies in spaced relationship, with coil assemblies positioned in the high-flux region of the magnets. By controlling the current flowing through the coils, force can be applied to adjust the position of the apparatus. Various other devices employ similar magnetic force actuators.

Similarly, U.S. Pat. No. 4,952,858 discloses a system for positioning a stage in a lithographic system using at least three magnetic coil actuators as well as at least three voice coil actuators. These actuators are mounted between the stage and a sub-stage, and together control the position of the stage in six degrees of freedom. Various other devices employ actuators between the stage and sub-stage, generally employing at least one actuator for each degree of freedom desired.

This disadvantages of these and other prior art systems include the difficulty in their assembly and operation, and the related possibility of errors during operation. These difficulties arise from, among other things, the various complexities associated with positioning and operating six or more force actuators between the stage and the sub-stage.

SUMMARY OF THE INVENTION

The present invention is directed to a method and apparatus for supporting and positioning a stage with respect to a frame. The stage is supported by one or more flexible support members which are flexible in at least one degree of freedom. The flexible support members are in turn mounted on movable base(s) which are adjustable in the remaining degrees of freedom.

Preferably, the invention is employed in a system for lithographic processing, such as the processing relating to the fabrication of semiconductor devices. A wafer is positioned on a stage, such as a wafer table, which must be positioned precisely to provide proper exposure, such as exposure to a source of radiant energy, on the wafer of the mask pattern. The stage may be mounted on and movable with respect to a frame, which may have a fixed position and/or alignment, or may itself be movable for coarse adjustments in position. The invention therefore provides manufacture of a wafer or other device using precise lithographic processing.

As used herein in discussing this embodiment, the x axis and y axis are generally interchangeable and generally form the plane substantially parallel to the surface of the wafer and/or the stage. The z axis is perpendicular to the x-y plane. Rotation about an axis is denoted by the θ symbol; e.g., $\theta_x$ refers to rotation about the x axis (or a parallel axis). Obviously, variations of this coordinate system may be employed to describe systems within the scope of the present invention.

The stage is supported by a plurality of flexible members. In fact, a single flexible member may sufficiently support the stage. The flexible member is flexible in five degrees of freedom, and supports the stage with respect to a movable base. Thus, the flexible member allows adjustment of the stage in five degrees of freedom. For instance, the flexible member may allow adjustment of the stage in the x, y $\theta_x$, $\theta_y$, and $\theta_x$, directions. Thus, the position of the stage may be adjusted in those five directions, and that adjustment will not be impeded by the flexible member. Such adjustment is preferably provided by actuators, such as magnetic actuators.

The flexible member is rigid, however, with respect to movement in the z direction. This is because the movable base is adjustable in the z direction. Thus, the position of the stage is adjusted in the z direction by adjusting the position of the movable base in the z direction. Preferably, the movable base is part of or connected to a magnetic actuator, although other types of actuators, such as voice coil actuators may also be employed within the scope of the invention. The movable base may itself be supported by flexible members which may be attached to the frame.

In another embodiment, the stage is supported by three flexible members. Each flexible member is connected to a movable base; i.e., a first flexible member is connected to a first movable base, a second flexible member is connected to a second movable base, and a third flexible member is connected to a third movable base. The position of the movable bases can then be adjusted using actuators, such as magnetic actuators. Adjustment of the stage in the z direction can then be achieved by adjustment of the three movable bases in concert, while rotation of the stage about the x and y axes can be achieved by differential adjustment of the three movable bases.

In other embodiments, the flexible member and movable base may provide flexibility in other combinations. For example, instead of the flexible member being flexible in five degrees of freedom and the base being flexible in the sixth degree of freedom, the flexible member could be flexible in three degrees of freedom while the movable base is flexible in three degrees of freedom. Preferably, the flexible member and the movable base, taken together, provide flexibility in six degrees of freedom.

The system of the present invention may be assembled and manufactured by connecting a table to a frame using flexures. One or more flexures are connected to the table, so that the table is movable relative to the frame. The flexures are connected to a movable base, which itself is adjustable relative to the frame. The movable base may also be supported by flexures. With the table flexibly supported, actuators may be positioned to effect the desired adjustment of the table. Alternatively, the table and/or the base may be supported by other support mechanisms, such as bellows or springs. The order of these steps is of course exemplary, and may be modified without departing from the present invention.

For a better understanding of these and other aspects of the present invention, reference should be made to the following detailed description taken in conjunction with the accompanying drawings.

BRIEF DESCRIPTION OF THE DRAWINGS

In the drawings, which are not necessarily to scale.

DETAILED DESCRIPTION OF THE INVENTION

The present invention is directed to a device and method for supporting and/or precisely positioning a stage with respect to a frame. Although the present invention may be used in any application requiring precise positioning of a stage or platform with respect to a frame, the present invention has particular application in a system for lithographic semiconductor processing.

Figure 2:
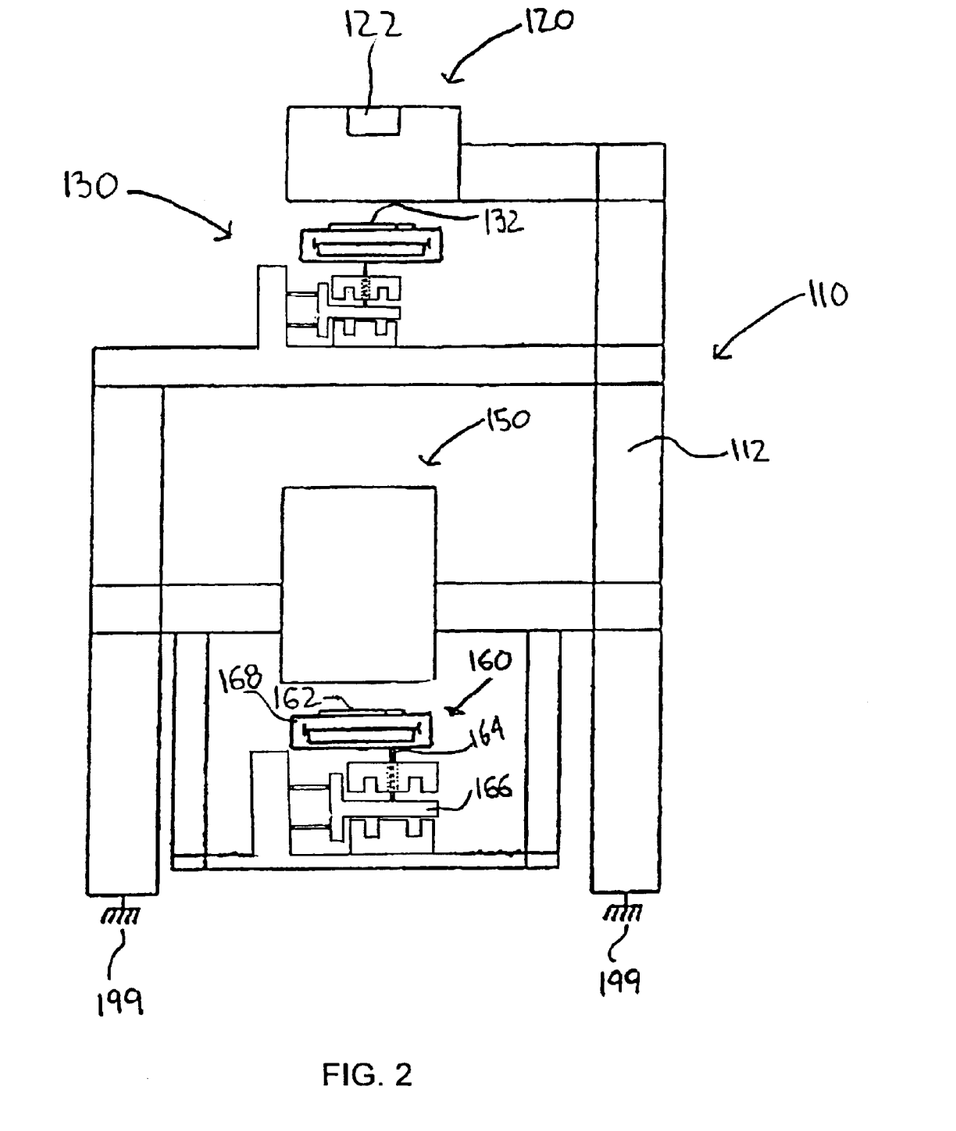
FIG. 2 is a side schematic view of a lithographic semiconductor processing system of the present invention.

Preferably, the positioning system of the present invention may be employed in a lithographic semiconductor processing system as shown schematically in FIG. 2. Lithographic processing is performed by an exposure apparatus 110. The components are mounted on a frame 112. These components include an illumination system 120, a reticle stage 130, a lens assembly 150 as an optical system, and a wafer stage 160. Any well-known variations of these systems, such as those described elsewhere in this patent specification, may be employed within the scope of the present invention.

The illumination source 122 may be any radiant energy source well-known in the art and suitable for the application of the positioning system. For instance, the illumination source 122 may be a g-line (436 nm), i-line (365 nm), KrF excimer laser (248 nm), ArF excimer laser (193 nm) or $F_2$ laser (157 nm). Alternatively, the illumination source 122 can also use charged particle beams such as x-ray or electron beam. For instance, in the case where an electron beam is used, therionic emission type lanthanum hexaboride ($LaB_6$) or tantalum (Ta) can be used as an electron gun. Furthermore, in the case where an electron beam is used, the structure may be such that either a mask is used or a pattern can be directly formed on a substrate without the use of a mask.

The lens assembly 150 projects and/or focuses the beam passing through the reticle 132 onto the wafer 162. Depending on the design of the exposure apparatus 110, the lens assembly can magnify or reduce the image illuminated on the wafer 162. Various lens assembly designs are well known. For instance, when far ultra-violet rays such as the excimer laser is used, glass materials such as quartz and fluorite that transmit far ultra-violet rays are preferable. When the $F_2$ type laser or x-ray is used, lens assembly 150 should preferably be either catadioptric or refractive (the reticle should also preferably be a reflective type), and when an electron beam is used, electron optics should preferably comprise electron lenses and deflectors. Such electron lenses, generally, include an assembly of magnetic coils. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. Pat. No. 5,892,117 also use a reflecting-refracting type of optical system incorporation a concave mirror, etc., but without a beam splitter, and can also be employed. The disclosures in the abovementioned U.S. patents, as well as the Japan Patent applications published in the Official Gazette for Laid-Open Patent Applications are incorporated herein by reference.

In one embodiment, the exposure apparatus 110 can be used as a scanning type lithography system which exposes the pattern from the reticle 132 onto the wafer 162 with the reticle 132 and the wafer 162 moving synchronously. Alternatively, the exposure apparatus 110 may be a step-and-repeat type lithography system in which the reticle 132 and wafer 162 are stationary, at least with respect to each other, during exposure, and the images on the reticle 132 are sequentially exposed onto fields of the wafer 162. In this type of process, the position of the wafer 162 is constant with respect to the reticle 132 during exposure of an individual field. Subsequently, between consecutive exposure steps, the wafer 162 is consecutively moved by the wafer assembly 160 so that the next field of the wafer 162 is brought into the proper position relative to the lens assembly 150 and reticle 132 for exposure. In some examples, the movement of the wafer is substantially in a plane perpendicular to the optical axis of the lens assembly 150. In this way, the pattern of the reticle 132 is repeatedly exposed onto sequential fields of the wafer 162.

The positioning system of the present invention is not limited to a lithography system for semiconductor manufacturing. Rather, the system of the present invention may be employed in any application where a stage must be precisely positioned with respect to a frame. For instance, the positioning system may be employed as an LCD lithography system that exposes a liquid crystal display device pattern onto a rectangular glass plate or a lithography system for manufacturing a thin film magnetic head. Further, the present invention may be applied to a proximity lithography system that exposes a mask pattern by closely locating a mask and substrate without the use of a lens assembly. Additionally, the present invention may be used in other devices, including other semiconductor processing equipment, machine tools, metal cutting machines, and inspection machines.

In the context of a lithography system for semiconductor processing, the positioning system of the present invention may have various applications. Referring again to FIG. 2, the positioning system may be employed to position the illumination assembly 120, the reticle stage 130, the lens assembly 150, the wafer stage 160, specific components of any of those assemblies or of other components of the exposure apparatus 110, and/or some combination of any of those assemblies or components. Similarly, the positioning system may be employed to position various components of any system where precise positioning of one component with respect to another is needed. As discussed in more detail below, the positioning system generally includes a flexible member 164 supporting the component 168. Because the flexible member 164 is flexible in five degrees of freedom, it allows positioning of the component 168 in five degrees of freedom. That positioning may be achieved through well known means (not shown in FIG. 2). The flexible member is in turn supported by a movable member or base 166. The movable base 166 is adjustable in a sixth degree of freedom.

Figure 3:
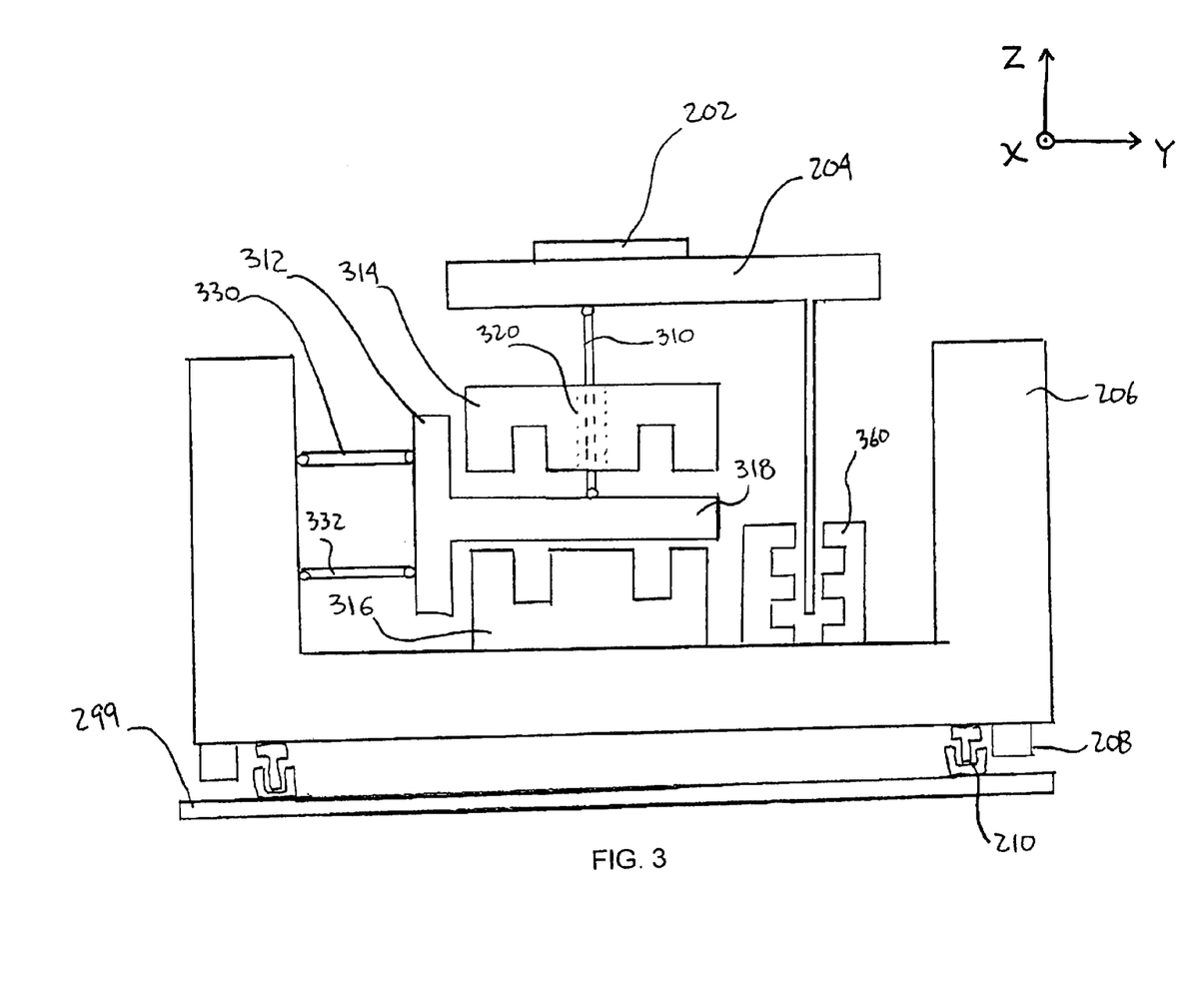
FIG. 3 is a side schematic view of a wafer positioning system of one embodiment of the present invention.

FIG. 3 illustrates in more detail an embodiment of the present invention in the context of wafer processing. As shown in FIG. 3, a wafer 202 is positioned on a wafer table 204. The wafer table 204 itself is positioned on, or movable with respect to, a wafer stage 206. The wafer stage 206 is also movable with respect to a frame 299. The terms wafer stage and wafer table are merely exemplary, and those of skill in the art will recognize that the terms may be interchanged, and that other terms may be used to refer to the two movable frames 204 and 206. For purposes of this invention, movement of the wafer table 204 with respect to the wafer stage 206 is merely exemplary of the movement of any table with respect to a frame using the principles of the present invention. For example, the invention may be used to position a reticle 132 and/or a reticle stage 130.

In the embodiment shown in FIG. 3, the wafer table 204 is movable with respect to the wafer stage 206, and the wafer stage is movable with respect to the frame 299. Preferably, the position of the wafer stage 206 can be adjusted for coarse positioning of the wafer 202, while the positioning of the wafer table 204 with respect to the wager stage 206 can be adjusted for finer positioning of the wafer 202. This type of nested positionability is a preferred design choice, but is not required to practice the invention.

In FIG. 3, the wafer stage 206 is schematically shown connected to the frame 299 through a number of mechanisms, including a bearing 208 and a magnetic actuator 210. The mechanisms shown in FIG. 3 are figuratively shown and, moreover, merely exemplary. Coarse positioning of the wafer stage 206 may be achieved through various mechanisms well known in the art. Examples of such mechanisms include linear motors of the air levitation type employing air bearings or a magnetic actuator (sometimes referred to as a magnetic levitation type actuator or an E-I core) using Lorentz force or reactance force (see U.S. Pat. No. 5,623,853 or 5,528,118, both of which are incorporated herein by reference). Other examples include a planar motor, another type of magnetic actuator which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage 206 and the other unit is mounted on the moving plane side of the frame 299. Additionally, the wafer stage 206 could move along a guide. In this embodiment, the magnetic actuator 210 moves the wafer stage 206 in the X, Y and $\theta_x$ directions on the frame 299.

Movement of the stages as described above generates reaction forces which can affect performance of the lithography system Reaction forces generated by the wafer (substrate) stage motion can be mechanically released to the floor (ground 199) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground 199) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As discussed above, the present invention is directed to support and positioning of a platform or stage with respect to a frame. In the example shown in FIG. 3, the wafer table 204 is supported and/or precisely positioned with respect to the wafer stage 206. Alternatively, the wafer stage 206 might be finely positioned with respect to the frame 299. Other components of that example could also be finely positioned in accordance with the present invention.

As shown in FIG. 3, the wafer table 204 is preferably supported by a flexible member 310. This flexible member is mounted on a movable base 312. The flexible member 310 is flexible in five degrees of freedom. For instance, as shown in FIG. 3, the flexible member 310 may be flexible in the x, y, $\theta_x$, $\theta_y$, and $\theta_z$ directions. Alternatively, a plurality of flexible members may be employed within the scope of the present invention, so long as the table is supported in a suitably flexible manner.

Various mechanisms known in the art may be employed as the flexible member 310. Preferably, the flexible member 310 comprises any suitable structure of flexible material. For instance, the flexible member 310 may comprise stainless steel or other metal with cross-sectional design and thickness to provide sufficient flexibility. Such members may be referred to as flexures. Alternatively, the flexible member may comprise polymers or any other material with suitable durability and flexibility.

Thus, the flexible member 310 facilitates movement of the wafer table 204 in five degrees of freedom. Actual adjustment of the wafer table may be achieved through various devices well known in the art. As shown schematically in FIG. 3, one or more magnetic actuators 360 may adjust the position of the wafer table in the x, y, $\theta_x$, $\theta_y$, and $\theta_z$ directions with respect to the wafer stage 206. Such a magnetic actuator may include at least one electromagnet and target. Alternatively, other types of actuators, such as voice coil actuators utilizing a Lorentz Force, may be employed within the scope of the present invention. Additionally, the number, positioning, and alignment of the actuators may be adjusted as desired.

The movable base 312 provides adjustment of the wafer table 204 in the remaining degrees of freedom with respect to the wafer stage 206. Preferably, the flexible member 310 is flexible in five degrees of freedom, while the movable base 312 is adjustable in a sixth degree of freedom. As shown in FIG. 3, the movable base 312 provides adjustment of the wafer table 204 in the z direction. Preferably, the movable base 312 comprises one magnet component 318 of a magnetic actuator including a plurality of coil assemblies 314, 316 positioned around the magnetic component 318. In other words, the movable base 312 is the "I" component of an "EI core" magnetic actuator. Adjustment of the current in the coil assemblies 314, 316 therefore causes movement of the movable base 312 in the z direction.

In addition, similar actuators could be employed to position the wafer table 204 in other degrees of freedom. For instance, three movable bases such as the base 312 shown in FIG. 3, each paired to magnetic components such as the components 314, 316 shown in FIG. 3 could be employed. Moving in concert, these actuators could provide adjustment in the z direction. Differential adjustment of the current in additional coil assemblies would provide adjustment of the movable base in the $\theta_x$ and $\theta_y$ directions.

Likewise, movement of the wafer table 204 in other degrees of freedom may be achieved using similar actuators 360. Preferably, these actuators comprise coil assemblies positioned around an "I" magnetic component, similar to the design of actuator components 312, 314, and 316. Such actuators 360 may be employed in various well known combinations. For example, one (or more) actuator 360 could be positioned to generate force in the x direction. Two or more actuators 360 may be positioned apart from each other but each oriented to apply force in the y direction. Those actuators would thereby providing adjustment of the wafer table 204 in the y and $\theta_z$ directions by applying force in concert or differentially.

Further, members with varying degrees of flexibility, and/or combinations of such members, could be employed within the scope of the present invention. For example, a flexible member may be employed which is flexible in only three degrees of freedom, while the movable base 312 is flexible in another three degrees of freedom.

As shown in FIG. 3, at least one coil assembly may include a bore 320 or other conduit. The flexible member 310 preferably extends through this bore 320 in order to connect with the movable base 318. By disposing the flexible member 310 connecting the wafer table 204 and the movable base 312 through the bore 320, the flexible member 310 can be positioned where the force generated by the magnetic actuator (magnet component 318 and coil assemblies 314, 316) acts on the wafer table 204 in the z direction. Alternatively, the system may be designed such that the coil assembly is not positioned in the path of the flexible member 310, and therefore the flexible member 310 is connected to the movable base 312 without the need for a bore 320.

The movable base 312 may be supported by various means. Preferably, as shown in FIG. 3, the movable base 312 is connected to the wafer stage 206 through a plurality of support members 330, 332. These support members 330, 332 permit movement of the movable base 312 only in the z direction; they are at least somewhat rigid to and therefore constrain movement in the other directions. These support members 330, 332 may be any suitable flexible structure known in the art. For instance, they may comprise relatively rigid strips, composed of metal, plastic, or any suitable material, which are very flexible in only one direction. In addition, these support members 330, 332 may be pivotally connected to the movable base 312 and/or the wafer stage 206, as necessary to allow movement of the movable base 312 in the z direction. Such pivotal connections may include, for example, a hinged connection or a ball and socket connection, as appropriate.

The support members 330, 332 may help to support the movable base 312 and therefore the wafer table 204. For instance, the support members may be designed to support the approximate gravitational weight of the movable base 312, flexible member 310, and wafer table 204. In practice, the support members 330, 332 may be designed to support some weight which may be greater or less than the actual gravitational weight of those components; preferably, the support members support a sufficient portion of the weight so that the actuator components 314, 316, and 318 need only apply the force necessary to effectuate changes in position.

In addition, more than one flexible member and associated supports may be used. Preferably, three flexible members such as the flexible member 310 shown in FIG. 3 are employed. Each flexible member is supported by a movable base such as movable base 312, support members 330, 332, and actuator components 314, 316, and 318. Movement of the table in the z direction is achieved by moving the three movable bases in unison. Movement of the table in the $\theta_x$ and $\theta_y$ directions is achieved by moving the movable bases differentially.

Figure 4:
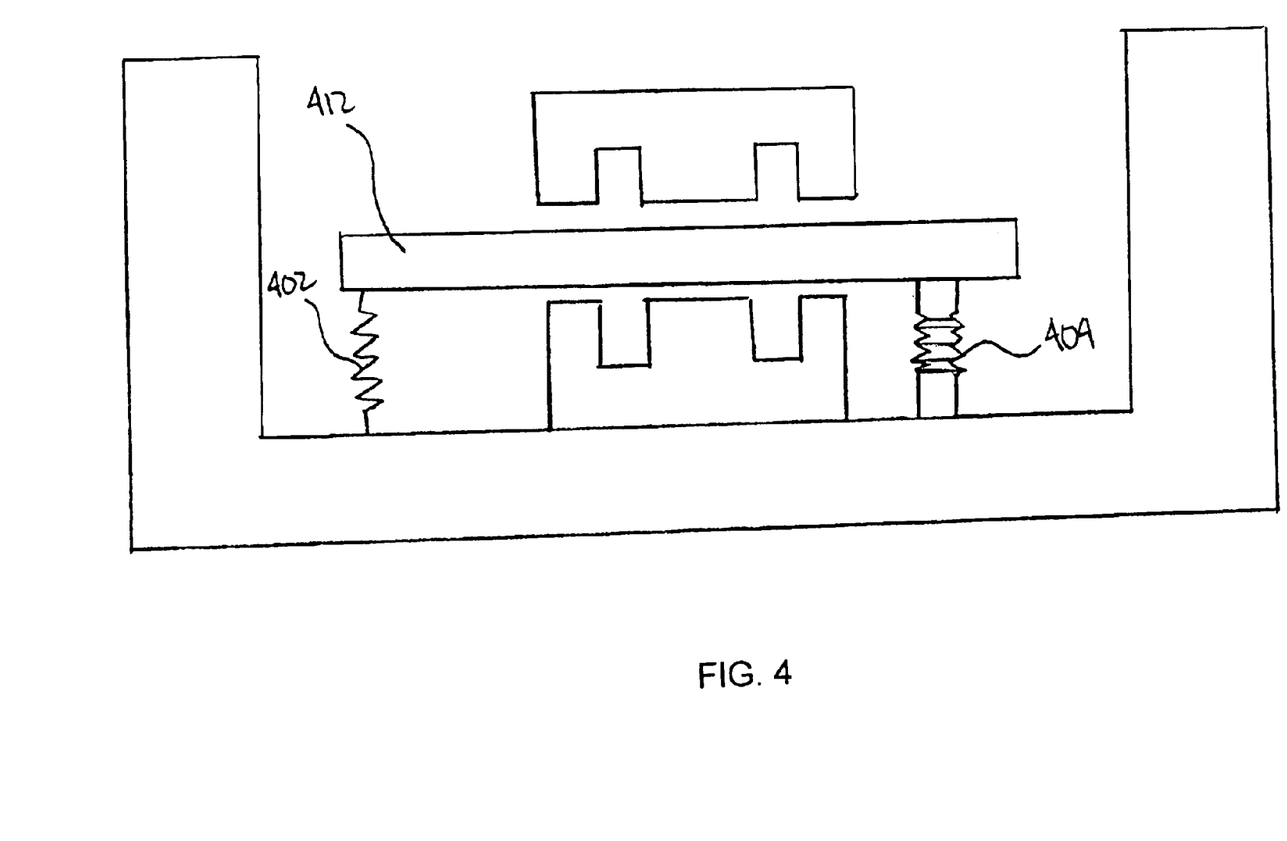
FIG. 4 is a partial side schematic view of another embodiment of a positioning system in accordance with the present invention.

Moreover, as shown schematically in FIG. 4, other means may be employed to support a movable base 412 in accordance with the present invention. For instance, one or more springs 402 may be employed to support the movable base 412. Alternatively, an air bellows 404 may perform that function. Other techniques well known in the art may also be employed within the scope of the present invention.

In operation, the system of the present invention provides support and precise positioning of the wafer 202. Coarse positioning of the wafer 202 with respect to the frame 299 (and therefore with respect to the reticle, which is not shown in FIGS. 3 and 4) is achieved by adjusting the position of the wafer stage 206. The positioning of the wafer table 204 with respect to the wafer stage 206 is provided in six degrees of freedom. Positioning in one direction, preferably the z direction, is achieved by adjusting the position of the movable base 312. Because the movable base 312 is connected to the wafer table 204 by the flexible member 310, which is rigid in the z direction, this adjustment of the movable base results in corresponding adjustment of the wafer table 204 in the z direction.

In the case where magnetic actuators are employed, the position is adjusted using precisely coordinated and calculated variation in the electric current to the actuators. The position in the other five degrees of freedom then provided by other actuators 360, in accordance with well known principles. Well known methods of measuring the position of the wafer stage, such as interferometer systems, may be employed as part of this process regardless of the types of actuators employed.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 5:
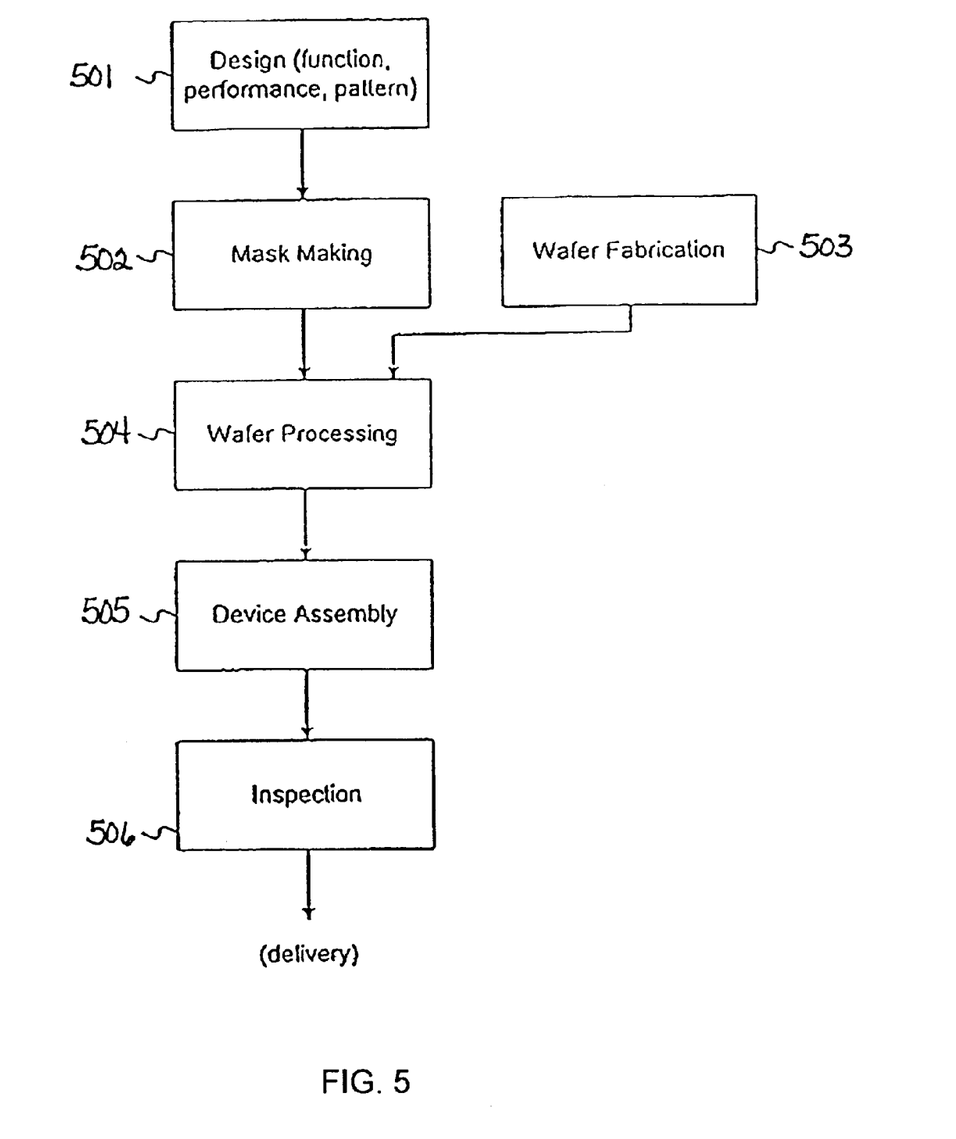
FIG. 5 is a schematic flow chart of a process for fabricating a positioning system in accordance with one embodiment of the present invention.

Further, semiconductor devices can be fabricated using the above described systems, by the process shown generally in FIG. 5. In step 501 the device's function and performance characteristics are designed. Next, in step 502, a mask (reticle) having a pattern is designed according to the previous designing step, and in a parallel step 503, a wafer is made from a silicon material. The mask pattern designed in step 502 is exposed onto the wafer from step 503 in step 504 by a photolithography system described hereinabove consistent with the principles of the present invention. In step 505, the semiconductor device is assembled (including the dicing process, bonding process and packaging process), then finally the device is inspected in step 506.

Figure 6:
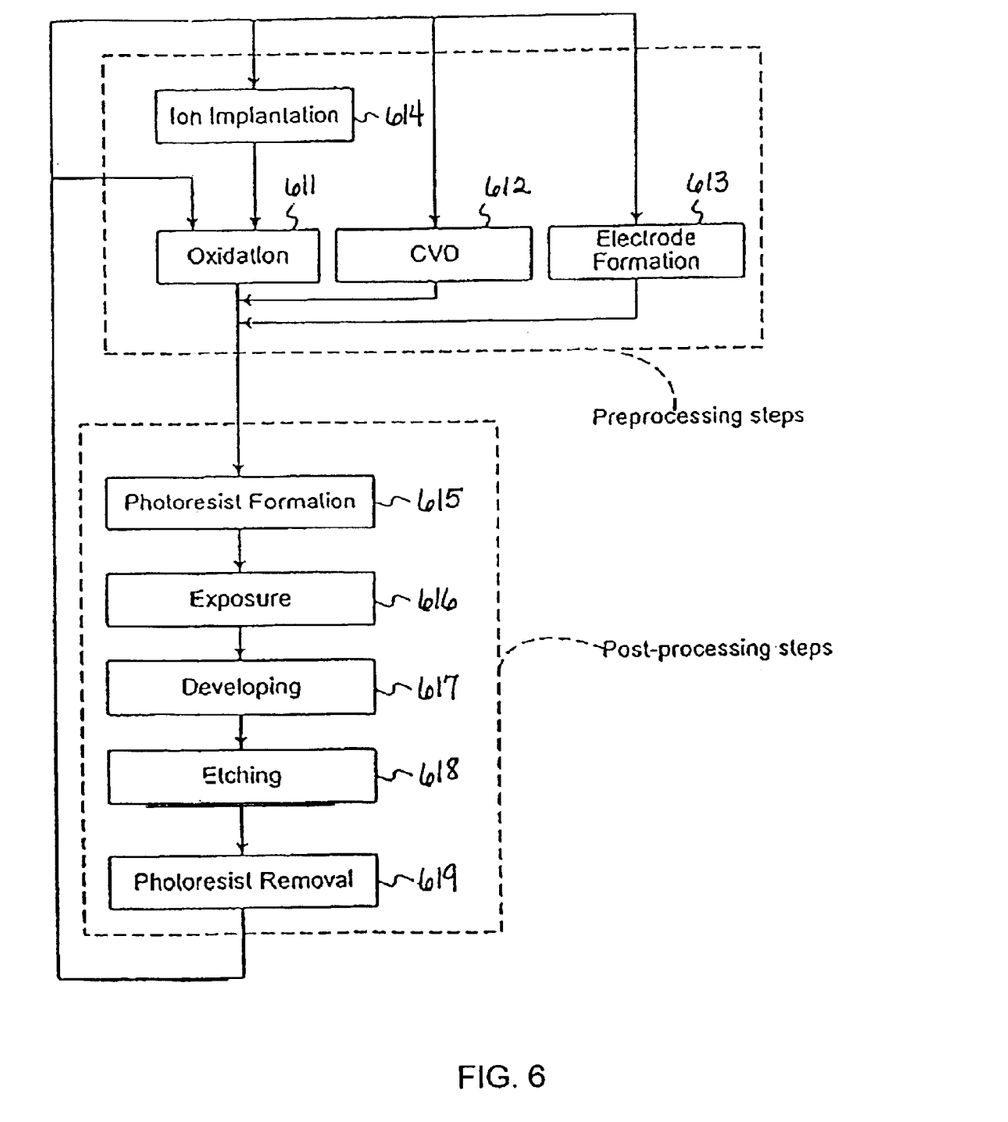
FIG. 6 is a more detailed schematic flow chart of a portion of the process of FIG. 6 in accordance with one embodiment of the present invention.

FIG. 6 illustrates a detailed flowchart example of the above-mentioned step 504 in the case of fabricating semiconductor devices. In step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611–614 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 615 (photoresist formation step), photoresist is applied to a wafer. Next, in step 616 (exposure step), the above-mentioned exposure device is used to transfer the circuit pattern of a mask (reticle) to a wafer. Then, in step 617 (developing step), the exposed wafer is developed, and in step 318 (etching step), parts other than residual photoresist (exposed material surface) are removed by etching. In step 619 (photoresist removal step), unnecessary photoresist remaining after etch is removed.

Multiple circuit patterns are formed by repetition of these preprocessing and post-processing steps.

Again, the present invention is not limited to lithographic semiconductor processing. To the contrary, the present invention may be employed in any application requiring precise positioning of a stage 204 with respect to some frame 206. Those skilled in the art to which the invention pertains may make modifications and other embodiments employing the principles of this invention without departing from its spirit or essential characteristics particularly upon considering the foregoing teachings. The described embodiments are to be considered in all respects only as illustrative and not restrictive and the scope of the invention is, therefore, indicated by the appended claims rather than by the foregoing description. Consequently, while the invention has been described with reference to particular embodiments, modifications of structure, sequence, materials and the like would be apparent to those skilled in the art, yet still fall within the scope of the invention.

What is claimed is:

1. A positioning system, comprising:
   a table having a surface to retain a workpiece;
   a first flexible member that connects said table to a first movable base, the first flexible member being rigid to movement in a first degree of freedom perpendicular to the surface, and flexible in other degrees of freedom;
   a support structure that supports said first movable base; and
   at least one magnetic actuator that translates said first movable base in said first degree of freedom.

2. The positioning system of claim 1, comprising at least one additional actuator to adjust the position of said table in at least a second degree of freedom.

3. The positioning system of claim 1, wherein said first movable base comprises a magnet, and said actuator comprises one or more coil assemblies.

4. The positioning system of claim 3, wherein a first said coil assembly includes a conduit therethrough, said first flexible member positioned in said conduit.

5. The positioning system of claim 1, said support structure comprising one or more bellows.

6. The positioning system of claim 1, said support structure comprising one or more springs.

7. The positioning system of claim 1, wherein the support structure permits movement of the first movable base in said first degree of freedom.

8. The positioning system of claim 1, wherein the magnetic actuator is an EI core type actuator.

9. The positioning system of claim 8, wherein the first movable base comprises an I component of the EI core type actuator.

10. An exposure apparatus, comprising:

a reticle stage having a surface to retain a reticle;

a first flexible member that connects the reticle stage to a first movable base, the first flexible member being rigid to movement in a first degree of freedom perpendicular to the surface, and flexible in other degrees of freedom;

a support structure that supports the first movable base; and at least one magnetic actuator that translates the first movable base in the first degree of freedom.

11. The positioning system of claim 10, wherein the support structure permits movement of the first movable base in said first degree of freedom.

12. The positioning system of claim 10, wherein the magnetic actuator is an EI core type actuator.

13. The positioning system of claim 12, wherein the first movable base comprises an I component of the EI core type actuator.

14. An exposure apparatus, comprising:

a wafer stage having a surface to retain a wafer;

a first flexible member that connects the wafer stage to a first movable base, the first flexible member being rigid to movement in a first degree of freedom perpendicular to the surface, and flexible in other degrees of freedom;

a support structure that supports the first movable base; and at least one magnetic actuator that translates the first movable base in the first degree of freedom.

15. The positioning system of claim 14, wherein the support structure permits movement of the first movable base in said first degree of freedom.

16. The positioning system of claim 14, wherein the magnetic actuator is an EI core type actuator.

17. The positioning system of claim 16, wherein the first movable base comprises an I component of the EI core type actuator.

* * * * *